(12) United States Patent
Higashi et al.

(10) Patent No.: US 6,462,379 B2
(45) Date of Patent: *Oct. 8, 2002

(54) SOI SEMICONDUCTOR DEVICE AND METHOD FOR MANUFACTURING THE SAME

(75) Inventors: Kenichi Higashi, Tenri (JP); Alberto Oscar Adan, Ikoma (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 75 days.

(21) Appl. No.: 09/311,309

(22) Filed: May 14, 1999

(65) Prior Publication Data

US 2001/0052613 A1 Dec. 20, 2001

(30) Foreign Application Priority Data

May 22, 1998 (JP) .............................. 10-141487

(51) Int. Cl.[7] ................................................ H01L 27/01
(52) U.S. Cl. ........................ 257/347; 257/351; 257/352; 257/353
(58) Field of Search ................................ 257/347, 382, 257/384, 353, 354, 351, 352, 386

(56) References Cited

U.S. PATENT DOCUMENTS

| 5,317,181 | A |   | 5/1994  | Tyson            |         |
| 5,440,161 | A |   | 8/1995  | Iwamatsu et al.  |         |
| 5,463,238 | A |   | 10/1995 | Takahashi et al. |         |
| 5,508,550 | A |   | 4/1996  | Morishita et al. |         |
| 5,552,624 | A |   | 9/1996  | Skotnicki et al. |         |
| 5,652,454 | A |   | 7/1997  | Iwamatsu et al.  |         |
| 5,770,881 | A | * | 6/1998  | Pelella          | 257/347 |
| 5,801,080 | A | * | 9/1998  | Inoue et al.     | 438/405 |
| 5,959,335 | A | * | 9/1999  | Bryant et al.    | 257/379 |
| 5,963,813 | A | * | 10/1999 | Manning          | 438/305 |
| 5,965,917 | A | * | 10/1999 | Maszara et al.   | 257/347 |
| 5,973,363 | A | * | 10/1999 | Staab et al.     | 257/347 |
| 5,973,364 | A | * | 10/1999 | Kawanaka         | 257/347 |

FOREIGN PATENT DOCUMENTS

| JP | 07074363   | 3/1995  | .................. 257/347 |
| JP | 07302908   | 11/1995 | .................. 257/347 |
| JP | 08125187   | 5/1996  | .................. 257/347 |
| WO | WO 96/28849 | 9/1996 |                            |

* cited by examiner

Primary Examiner—Olik Chaudhuri
Assistant Examiner—Nathan W. Ha
(74) Attorney, Agent, or Firm—Nixon & Vanderhye P.C.

(57) ABSTRACT

A SOI semiconductor device comprises: a SOI substrate in which a buried dielectric film and a surface semiconductor layer are laminated; at least one well formed in the surface semiconductor layer; and at least one transistor which is formed in the well and has a channel region and source/drain regions in the surface semiconductor layer, wherein the well is completely isolated in the surface semiconductor layer and has a well-contact for applying a bias voltage to the well, the transistor is isolated by a device isolation film formed in a surface of the surface semiconductor layer, the channel region is partially depleted, and the surface semiconductor layer under the source/drain regions is fully depleted.

8 Claims, 8 Drawing Sheets

SOI SEMICONDUCTOR DEVICE AND METHOD FOR MANUFACTURING THE SAME

CROSS-REFERENCES TO RELATED APPLICATIONS

This application is related to Japanese patent application No. HEI 10-141487 filed on May 22, 1998 whose priority is claimed under 35 USC §119, the disclosure of which is incorporated herein by reference in its entirety.

BACKGROUND OF THE INVENTION

1. Field of the Invention

The present invention relates to a SOI semiconductor device and a method for manufacturing the same, and more particularly to a SOI semiconductor device in which driving capability in an active state is improved and electric current consumption in a standby state is reduced, and a method for manufacturing the same.

2. Description of the Related Art

In recent years, as a substrate to be used for achieving high speed operation and high integration, a so-called SOI substrate, which is a substrate including a very thin semiconductor layer formed on a buried dielectric film, such as a substrate having a single crystal silicon layer, is attracting public attention.

If a complementary MISFET is formed on the SOI substrate, a considerable reduction of any of source-substrate capacitance, drain-substrate capacitance and gate-substrate capacitance is achieved due to the thin single crystal silicon layer, as compared with a conventional MISFET formed on a bulk silicon substrate. Therefore, the high speed operation of an integrated circuit may be achieved. Also, since the buried dielectric film is present, it is possible to form a very narrow device isolation region between two adjacent transistors as compared with the bulk silicon substrate, thereby achieving a further high integration.

On the other hand, the SOI substrate has a drawback that, if the integrated circuit is to be operated with a very low power voltage of 1 V or less, a leak current in the standby state is still large, leading to a large electric current consumption.

In order to solve this problem, Japanese Unexamined Patent Publication Nos, HEI 7(1995)-302908 and HEI 8(1996)-125187 and the like propose a semiconductor integrated circuit including a so-called four-terminal device in which a body contact is formed in each transistor formed on the SOI substrate.

The semiconductor integrated circuit including the four-terminal device is formed on a SOI substrate 40 in which a buried dielectric film 42 and a very thin single-crystal silicon layer 43 are formed on a supporting substrate 41, as shown in FIG. 12. On the single-crystal silicon substrate 43 are formed a PMOSFET 47 mainly composed of a gate electrode 46, a gate dielectric film and source/drain regions 48, and an NMOSFET 57 mainly composed of a gate electrode 56, a gate dielectric film and source/drain regions 58. These FETs are isolated by a device isolation film 44. Further, body contacts 45, 55 are formed near the PMOSFET 47 and the NMOSFET 57.

The four-terminal device in a semiconductor integrated circuit having such a construction has an advantage that an electric potential of a channel portion of each transistor may be controlled by applying a voltage to the body contacts 45, 55, whereby a threshold voltage which is one of the factors determining the transistor characteristics, for example, may be dynamically changed.

However, the four-terminal device having the body contacts 45, 55 has a drawback that the cell area is increased as compared with a conventional MOSFET.

Also, Japanese Unexamined Patent Publication No. HEI 7(1995)-74363 proposes a semiconductor device in which one well contact is formed for a plurality of MOSFETs instead of forming the well contact for each MOSFET, so as to achieve reduction of the cell area.

However, in this semiconductor device, a very thin silicon film having a thickness of 50 to 100 nm is used as the surface semiconductor layer, and moreover, the electric potential of the well is fixed by using the well contact, so that the leak current in the standby state is still large, leading to large electric current consumption.

SUMMARY OF THE INVENTION

The present invention has been made in view of these circumstances and the purpose thereof is to provide a SOI semiconductor device and a method for manufacturing the same in which driving capability in an active state is improved, electric current consumption in a standby state is reduced, and also the cell area of the semiconductor device is kept to a minimum, thereby achieving further scale reduction.

Accordingly, the present invention provides a SOI semiconductor device comprising: a SOI substrate in which a buried dielectric film and a surface semiconductor layer are laminated; at least one well formed in the surface semiconductor layer; and at least one transistor which is formed in the well and has a channel region and source/drain regions in the surface semiconductor layer, wherein the well is completely isolated in the surface semiconductor layer and has a well-contact for applying a bias voltage to the well, the transistor is isolated by a device isolation film formed in a surface of the surface semiconductor layer, the channel region is partially depleted, and the surface semiconductor layer under the source/drain regions is fully depleted.

Also, the present invention provides a method for manufacturing a SOI semiconductor device having the above-mentioned construction, wherein complete isolation of the well is achieved by forming a dielectric film that reaches the buried dielectric film in a predetermined region of the surface semiconductor layer.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

A SOI semiconductor device of the present invention is composed of a SOI substrate in which a buried dielectric film and a surface semiconductor layer are laminated; at least one well formed in the surface semiconductor layer; a well complete-isolation film that completely isolates the well (the isolation may be achieved by mesa isolation); a well contact for applying a bias voltage to the well; at least one transistor formed in the well; and a device isolation film for isolating the transistor.

The SOI substrate may be a substrate typically formed by laminating a buried dielectric film and a surface semiconductor layer successively on a supporting substrate, so as to achieve low power consumption and high speed operation, and may be a substrate used as a bonding SOI (BESOI) or SIMOX (Separation by Implantation of Oxygen) type substrate, or the like. The supporting substrate may be selected from a variety of substrates such as a semiconductor substrate of silicon, germanium or the like, a compound semiconductor substrate of GaAs, InGaAs or the like, and an insulating substrate of sapphire, quartz, glass or plastics. Here, the supporting substrate may include an element such as a transistor or a capacitor, or a circuit formed on the supporting substrate.

The buried dielectric film may be, for example, an $SiO_2$ film or an SiN film. The thickness of the buried dielectric film may be suitably adjusted by considering the characteristics of the semiconductor device to be obtained, the magnitude of the applied voltage in using the obtained semiconductor device or the like. The thickness of the dielectric film may be, for example, about 50 to about 400 nm.

The surface semiconductor layer is a semiconductor thin film that acts as an active layer for forming the transistor, and may be formed with a thin film made of a semiconductor such as silicon or germanium, or a compound semiconductor such as GaAs or InGaAs. Among these, a silicon thin film is preferable. It is necessary that the surface semiconductor layer has a film thickness $T_{semi}$ which is smaller than or equal to a sum of a depth $X_j$ of source/drain regions of a later-mentioned transistor and a width $W_{dep1}$ of a depleted layer under the source/drain regions from a junction interface and larger than or equal to about 100 nm, i.e.

about 100 nm $\leq T_{semi} < X_j + W_{depl}$.

Figure 10:
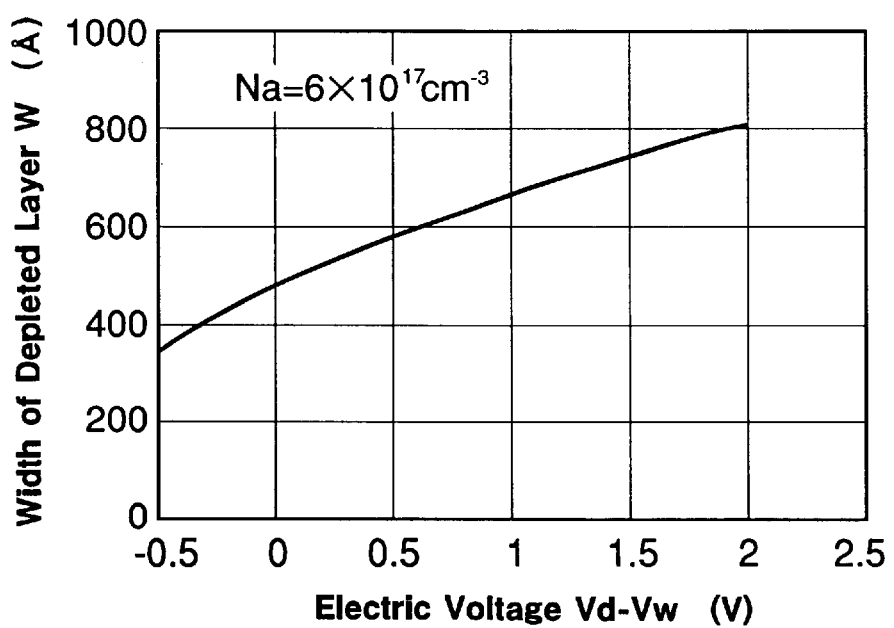
FIG. 10 is a view for explaining a relationship between the width of the depletion layer and voltages ($V_d$-$V_W$) in the SOI semiconductor device of the present invention.

Specifically, the thickness of the surface semiconductor layer may be selected within the range of about 100 nm to 400 nm. Here, although both $X_j$ and $W_{dep1}$ may be suitably adjusted in accordance with the characteristics of the semiconductor device to be obtained, they may be set up to about 200 nm. Further, the width $W_{depl}$ of the depleted layer are influenced by the impurity concentration of a later-mentioned well, the magnitude of a bias voltage $V_w$ applied to the well of the obtained SOI semiconductor device, and further the dielectric constant $\varepsilon$ of the semiconductor constituting the surface semiconductor layer, the electric charge q, the magnitude of the voltage $V_d$ to be applied to the source/drain regions, a built-in voltage $V_{bi}$ and the like. For example, even if the impurity concentration $N_a$ of the well is set to be $6 \times 10^{17}$ cm$^{-3}$, the width $W_{depl}$ of the depleted layer changes in accordance with (the drain voltage $V_d$)-(the bias voltage $V_W$ of the well) as shown in FIG. 10. Therefore, in addition to the above formula, the width $W_{depl}$ of the depleted layer must satisfy the following relationship:

$$W_{depl} = \sqrt{\frac{2\varepsilon}{q \cdot N_a}(V_d - V_w + V_{bi})}$$

The surface semiconductor layer in the SOI substrate includes at least one well. The well may be a p-type or n-type well. The concentration of the well may be suitably adjusted by considering the characteristics of the semiconductor to be obtained. The concentration of the well may be, for example, in the order of $10^{16}$ to $10^{18}$ ions/cm$^3$.

The well is completely isolated from a region of the surface semiconductor layer other than the well. This complete isolation of the well may be achieved by the LOCOS method in which a LOCOS oxide film is formed to extend from the surface of the surface semiconductor layer to the buried oxide film, i.e. a LOCOS film having a thickness larger than the thickness of the surface semiconductor layer. Alternatively, the complete isolation of the well may be achieved by the trench device isolation method in which a trench device isolation film is formed to extend from the surface of the surface semiconductor layer to the buried dielectric film by forming a trench in a desired region of the surface semiconductor layer and forming/burying a dielectric film in the trench, followed by an optional planarization treatment. Still alternatively, the complete isolation of the well may be achieved by the mesa isolation method in which a desired region of the surface semiconductor layer is removed till the removed portion reaches the buried dielectric film. The LOCOS method, the trench device isolation method, and the mesa isolation method may be carried out by utilizing a known process, such as a photolithography process, an etching process, a CMP process, or the like.

The well includes a well-contact for applying a predetermined bias voltage to the well. The number of well-contacts to be formed in one well may be adjusted in accordance with the size of the well, the number of transistors to be formed in the well, or the like. However, it is preferable that one well includes one well-contact in view of reduction of the area occupied by the device.

The well-contact is typically a part of the well and may be formed by connecting an electrode to a contact region which is to become a suitable contact resistance. The contact region to be formed may have an impurity concentration in the order of $10^{20}$ ions/cm$^3$ or more. The electrode may be formed of any material as long as it is an electrically conductive material that may be generally used as an electrode or a wiring layer.

A transistor is formed at the well in the surface semiconductor layer of the SOI substrate of the present invention. The transistor includes a gate electrode formed via a gate oxide film and source/drain regions formed in the surface semiconductor layer on both sides of the gate electrode. The gate oxide film may be formed with a material and a thickness such that it generally functions as a gate electrode. The gate electrode may be formed to a thickness of about 150 nm to about 300 nm with a polysilicon; a silicide of a high melting point metal such as W, Ta, Ti, or Mo; a polycide made of such a silicide and polysilicon; another metal or the like. Here, the gate electrode may include a sidewall spacer made of a dielectric film in view of lateral diffusion of an impurity for forming the later-mentioned source/drain regions. The source/drain regions may be formed to contain an impurity of a conductivity type opposite to that of the well at a concentration of about $1 \times 10^{20}$ to $1 \times 10^{21}$ ions/cm$^3$. Here, the source/drain regions may include a low concentration region such as an LDD structure, a region of the same degree of concentration, or a high concentration region at the end of the source/drain region on the channel side and with a depth which is a little smaller than a junction depth of the source/drain regions. The depth of the source/drain regions may be, for example, about 70 nm to about 200 nm, although the depth may be suitably adjusted in accordance with the characteristics of the semiconductor device to be obtained or the like.

The transistor formed at the well is isolated from another transistor by a device isolation film. The device isolation film may be formed by a known device isolation method such as the LOCOS method, the trench isolation method or the like. Here, the device isolation film is formed only in the surface of the well, and is not formed to extend along the entire depth of the surface semiconductor layer. Also, the device isolation film is usually formed before the transistor is formed. However, the above-mentioned process of complete isolation of the well may be performed after the device isolation film is formed, or alternatively, the device isolation film may be formed in the surface of the well after the process of complete isolation of the well is performed.

With respect to the transistor in the SOI semiconductor device of the present invention, the channel region constituting the transistor is partially depleted, and the surface semiconductor layer under the source/drain regions is fully depleted. Here, the partially depleted layer of the channel region means that the channel region immediately under the gate electrode is uniformly depleted between the source/drain regions, while a portion of the surface semiconductor layer under the depleted region is not depleted. Also, the fully depleted layer under the source/drain region means that the portion of the surface semiconductor layer under the source/drain regions is fully or completely depleted, namely, that the portion of the surface semiconductor layer from the junction interface of the source/drain regions to the interface between the surface semiconductor layer and the buried dielectric film is fully depleted.

By controlling the channel region to be partially depleted, the voltage applied to the well-contact is transmitted to the non-depleted region to achieve the electric potential control of the channel region. Also, since the surface semiconductor layer under the source/drain regions is fully depleted, the capacitance generated by the depleted layer extending under the source/drain regions is connected to the capacitance of the buried dielectric film in series, so that the load capacitance of the transistor may be reduced, thereby leading to low consumption of electric power and high speed operation of the device as a whole.

Also, in the SOI semiconductor device of the present invention, the threshold voltage of the transistor can be controlled by applying a bias voltage to the well-contact and changing the bias voltage. By fixing the bias voltage to a predetermined constant voltage, it is possible to improve the driving capability of the transistor in an active state (ON-state) or to reduce the leak current or electric current consumption in a standby-state (OFF-state). As another technique, both the effect of improvement in the driving capability and the effect of reduction in the electric current consumption may be obtained by changing the voltage between the active state and the standby state. For example, the bias voltage may be selected within the range of about −2 V to about 1 V. Specifically, if the transistor is an NMOS, the bias voltage may be, for example, about the power voltage in the active state, and approximately 0 V in the standby state. If the transistor is a PMOS, the bias voltage may be, for example, about −0.5 V in the active state, and about the power voltage in the standby state.

Hereafter, embodiments of the SOI semiconductor device of the present invention and the method for manufacturing the same will be explained with reference to the attached drawings.

Figure 1:
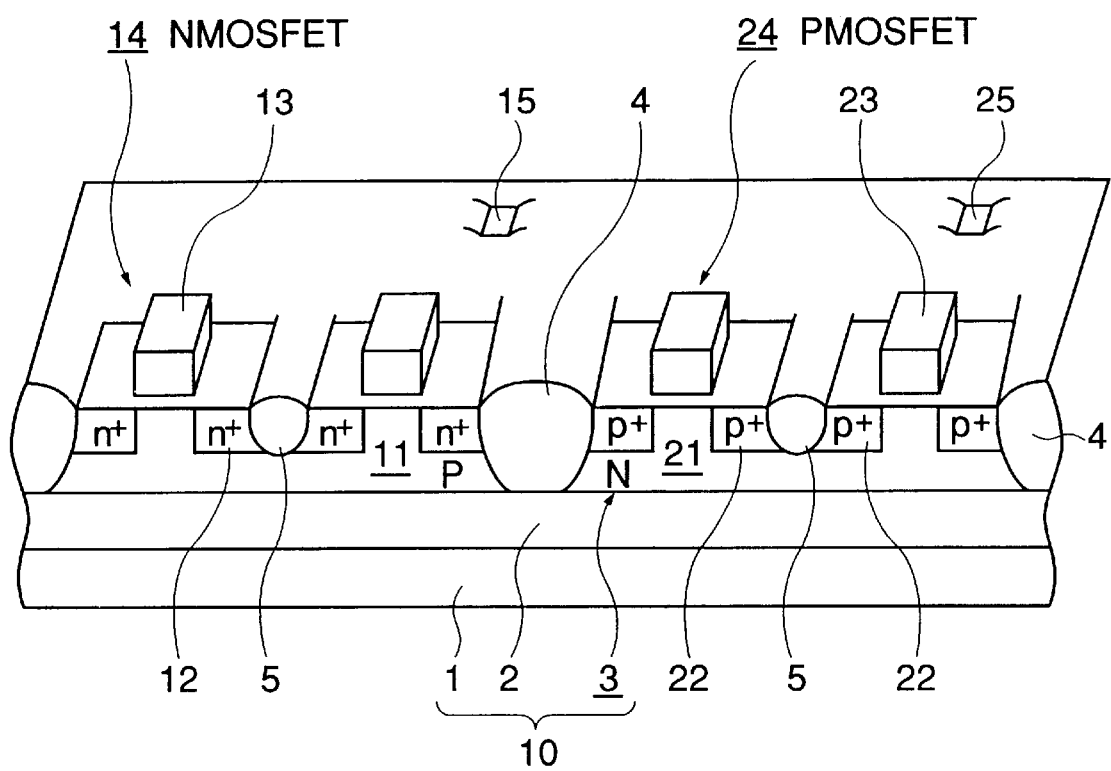
FIG. 1 is a schematic perspective cross-sectional view showing an essential portion of a SOI semiconductor device according to the present invention.

FIG. 1 is a view showing a SOI semiconductor device of the present invention. The semiconductor device is formed on a SOI substrate 10 including a buried dielectric film 2 and a surface silicon layer 3 formed on a supporting substrate 1. The surface silicon layer 3 and the buried dielectric film 2 are formed to have a thicknesses of about 180 nm and a thickness of about 50 to about 400 nm, respectively.

The surface silicon layer 3 includes a P-well 11 and an N-well 21 each formed to have an impurity concentration in the order of $10^{16}$ to $10^{18}$ ions/cm$^3$. A well complete-isolation oxide film 4 having a thickness equal to or larger than the thickness of the surface silicon layer 3 is formed between the P-well 11 and the N-well 21 so as to completely isolate the P-well 11 and the N-well 21.

At the P-well 11, an NMOSFET 14 is formed including source/drain regions 12 and a gate electrode 13 in an active region defined by the device isolation film 5 for isolating the MOSFETs, and further a P-well-contact 15 is formed. At the N-well 21, an NMOSFET 24 is formed including source/drain regions 22 and a gate electrode 23 in an active region defined by the device isolation film 5 for isolating the MOSFETs, and further an N-well-contact 25 is formed.

The source/drain regions 12, 22 are each formed to have a junction depth of about 150 nm, whereby a depleted layer (not shown) formed under the source/drain regions 12, 22 has a width of about 30 nm.

Hereafter, the method for manufacturing the SOI semiconductor device of the present invention will be explained.

Figure 2:
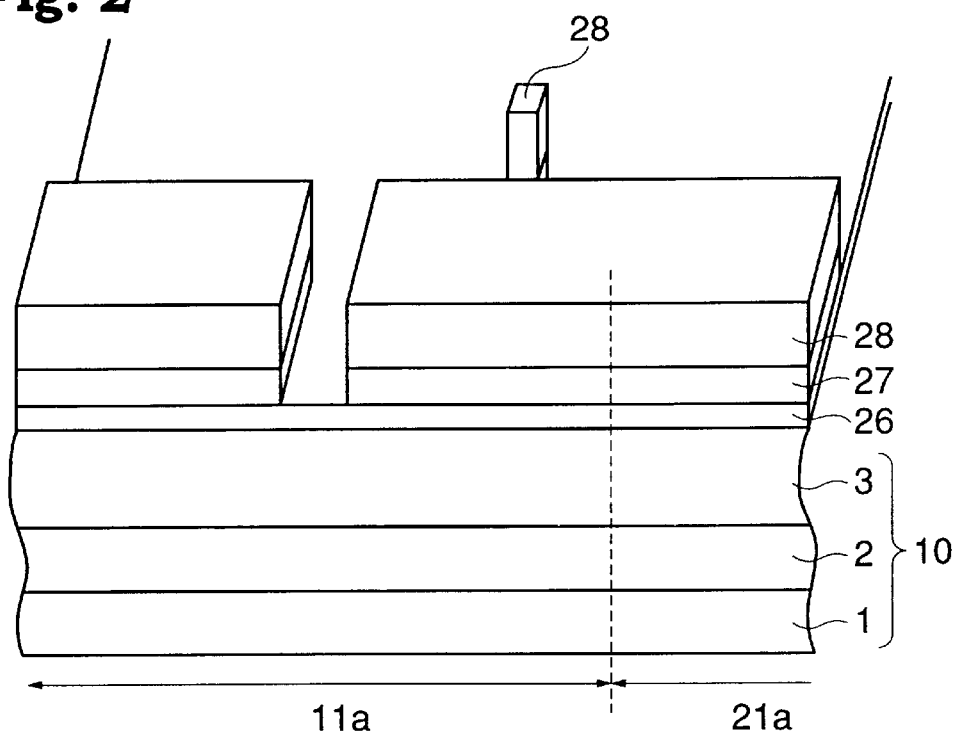
FIG. 2 is a schematic perspective cross-sectional view showing a step for manufacturing the SOI semiconductor device of FIG. 1.

Referring to FIG. 2, a SOI substrate 10 is formed by forming a buried dielectric oxide film 2 of about 100 nm thickness and a surface silicon layer 3 of about 180 nm thickness on a supporting substrate 1 made of p-type silicon.

The SOI substrate 10 is thermally oxidized at a temperature of 800° C. or more to form a thermal oxide film 26 of about 7 nm thickness on the surface of the SOI substrate 10. Then, a silicon nitride film 27 of about 80 nm thickness and a photoresist 28 are deposited on the thermal oxide film 26, followed by a photolithography and etching process to pattern the photoresist 28 into a desired shape. With this photoresist 28 used as a mask, the silicon nitride film 27 is dry-etched to leave a portion of the silicon nitride film 27 at a desired location by utilizing a gas containing a mixture of $CHF_3$ and $SF_6$.

Figure 3:
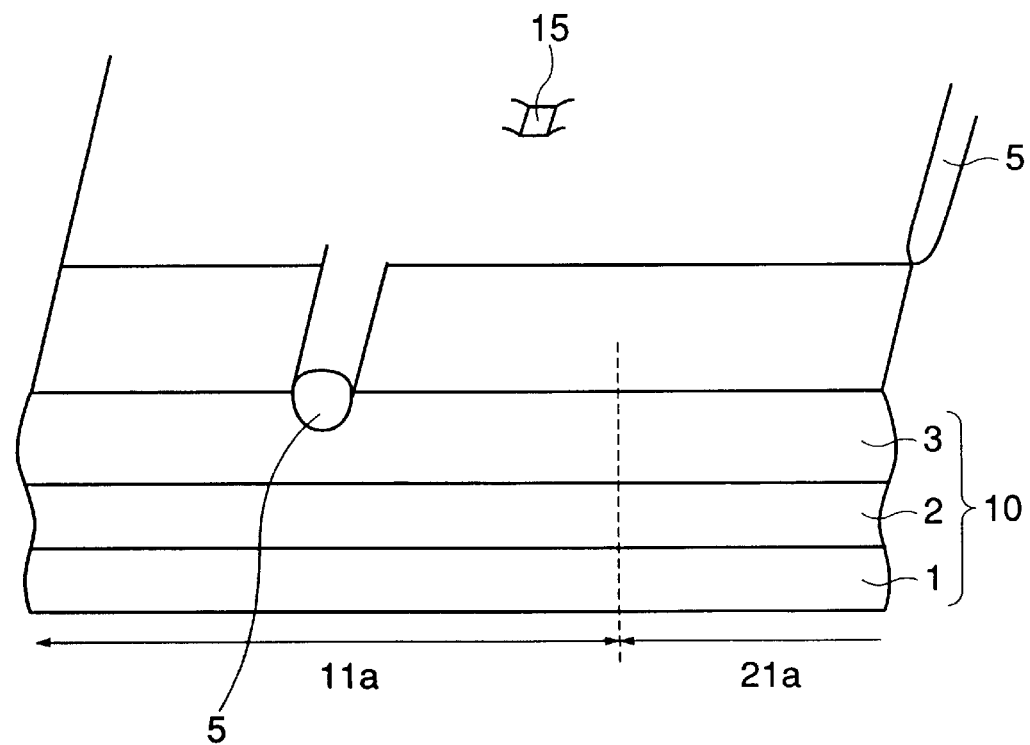
FIG. 3 is a schematic perspective cross-sectional view showing a step for manufacturing the SOI semiconductor device of FIG. 1.

Then, the photoresist 28 is removed, and thermal oxidation is performed at a temperature of 1000° C. or more to form a device isolation film 5 that does not reach the depth of the surface silicon layer 3, as shown in FIG. 3. This means that the surface silicon layer 3 is not oxidized to its entire depth. Further, a well-contact 15 is formed, followed by removal of the silicon nitride film 27 by using phosphoric acid.

Figure 4:
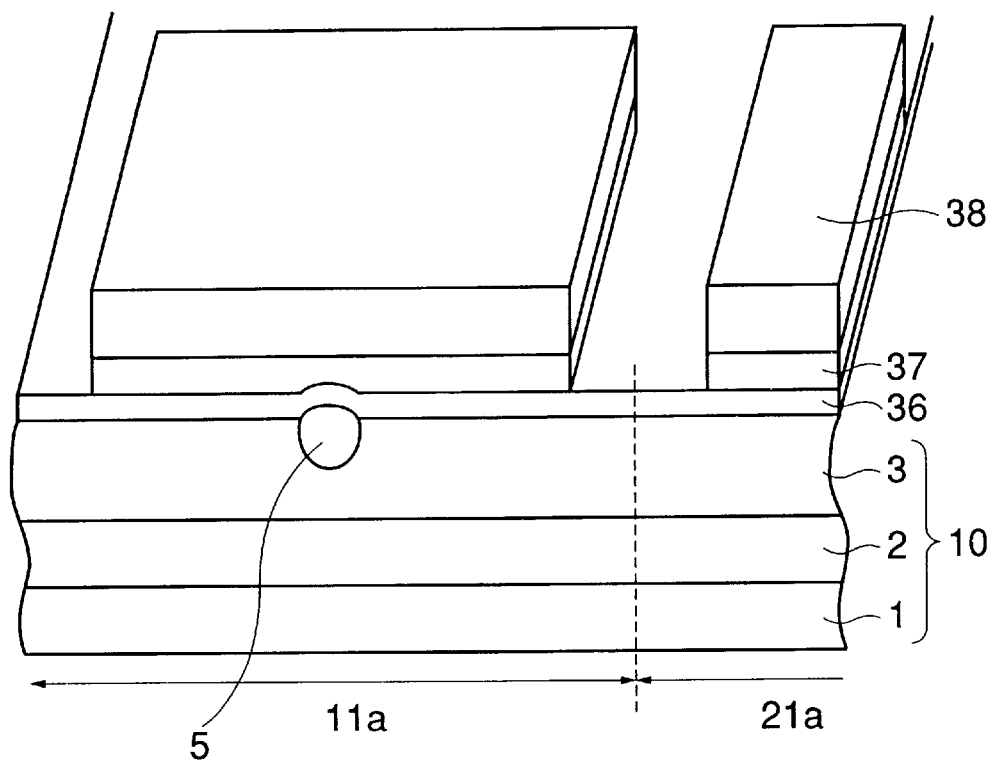
FIG. 4 is a schematic perspective cross-sectional view showing a step for manufacturing the SOI semiconductor device of FIG. 1.

Subsequently, the obtained SOI substrate 10 is thermally oxidized again at a temperature of 800° C. or more to form a thermal oxide film 36 of 10 nm thickness on the surface of the SOI substrate 10, as shown in FIG. 4. Then, a silicon nitride film 37 of about 20 nm thickness and a photoresist 38 are deposited on the thermal oxide film 36, followed by a photolithography and etching process to pattern the photoresist 38 into a desired shape. With this photoresist 38 used as a mask, the silicon nitride film 37 is dry-etched to leave a portion of the silicon nitride film 37 at a desired location by utilizing a gas containing a mixture of $CHF_3$ and $SF_6$.

Figure 5:
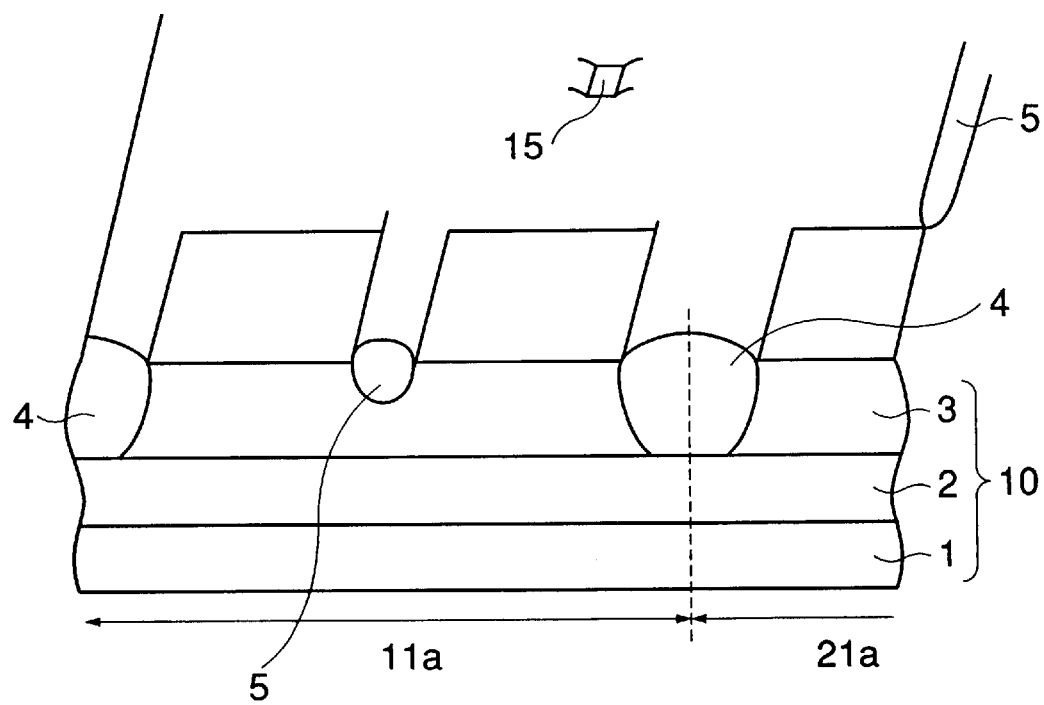
FIG. 5 is a schematic perspective cross-sectional view showing a step for manufacturing the SOI semiconductor device of FIG. 1.

Then, the photoresist 38 is removed, followed by thermal oxidation at a temperature of 1000° C. or more to form a well complete-isolation film 4 that reaches the depth of the surface silicon layer 3, as shown in FIG. 5. This means that the surface silicon layer 3 is oxidized to its entire depth. Thereafter, the silicon nitride film 37 is removed by using phosphoric acid.

Next, boron ions and phosphorus ions are implanted into a P-well formation region 11a and an N-well formation region 21a, respectively, by a known method with an acceleration energy of about 60 keV and a dosage of about $7 \times 10^{12}$ $cm^{-2}$, so as to form a P-well 11 and an N-well 21 having a final impurity concentration of about $6 \times 10^{17}$ $cm^{-3}$.

Subsequently, a gate dielectric film of about 10 nm thickness by thermal oxidation at around 800° C. and a polysilicon film of about 200 nm thickness are formed, followed by dry etching using an HBr-based or HCl-based etching gas to form gate electrodes 13, 23 having a desired shape. With these gate electrodes 13, 23 used as a mask, phosphorus ions for the NMOS, for example, are implanted with an acceleration energy of about 60 keV and a dosage of about $5 \times 10^{15}$ $cm^{-2}$ to form source/drain regions 12, 22 having a junction depth of about 150 nm, thereby completing a SOI semiconductor device including the NMOSFET 14, the PMOSFET 24 and the like, as shown in FIG. 1.

This process realizes a SOI semiconductor device in which the surface semiconductor layer at the channel region is partially depleted and the surface semiconductor layer at the source/drain regions is fully depleted.

Figure 6:
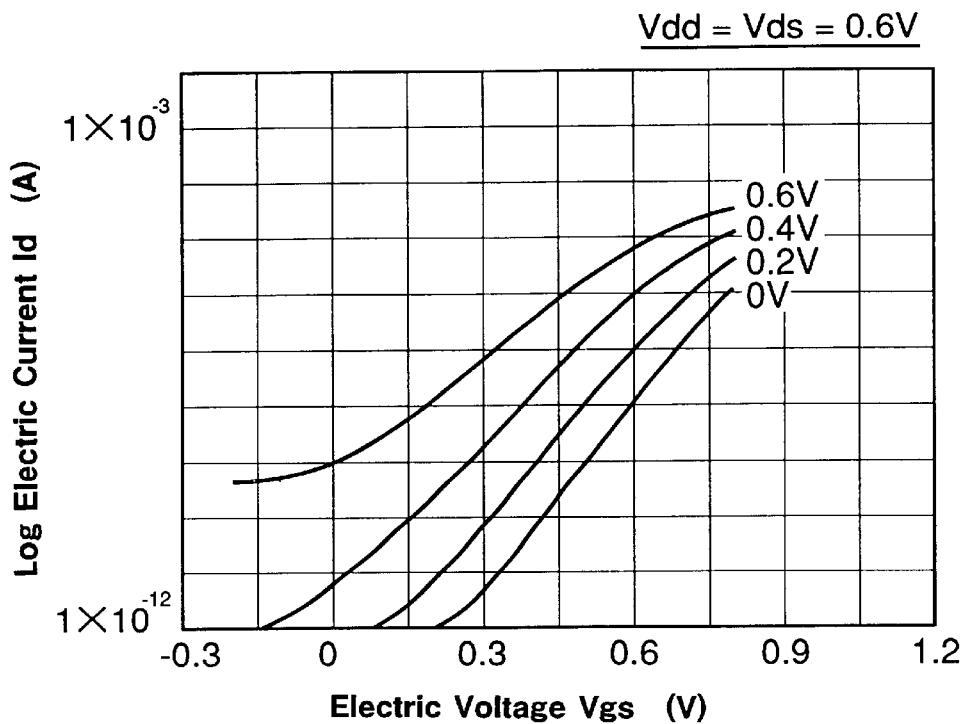
FIG. 6 is a view showing $I_d$-$V_g$ (subthreshold) characteristics of a transistor when a well bias voltage is applied in the SOI semiconductor device of the present invention.

In the SOI semiconductor device manufactured by the above process, electric current-voltage characteristics of the NMOSFET were measured when bias voltages $V_w$ within the range of 0 to 0.6V were applied to the well-contact of the P-well. The results are shown in FIG. 6. Here, FIG. 6 shows a view showing measurement results obtained under a condition of $V_{ds}$=0.6 V using a MOSFET with a gate length of 0.35 μm and a gate width of 2 μm.

From FIG. 6, it will be understood that the threshold voltage of the transistor may be controlled by applying a bias voltage to the well-contact and increasing the bias voltage, namely, that the degree of freedom in the drain current may be increased by changing the bias voltage.

Figure 7:
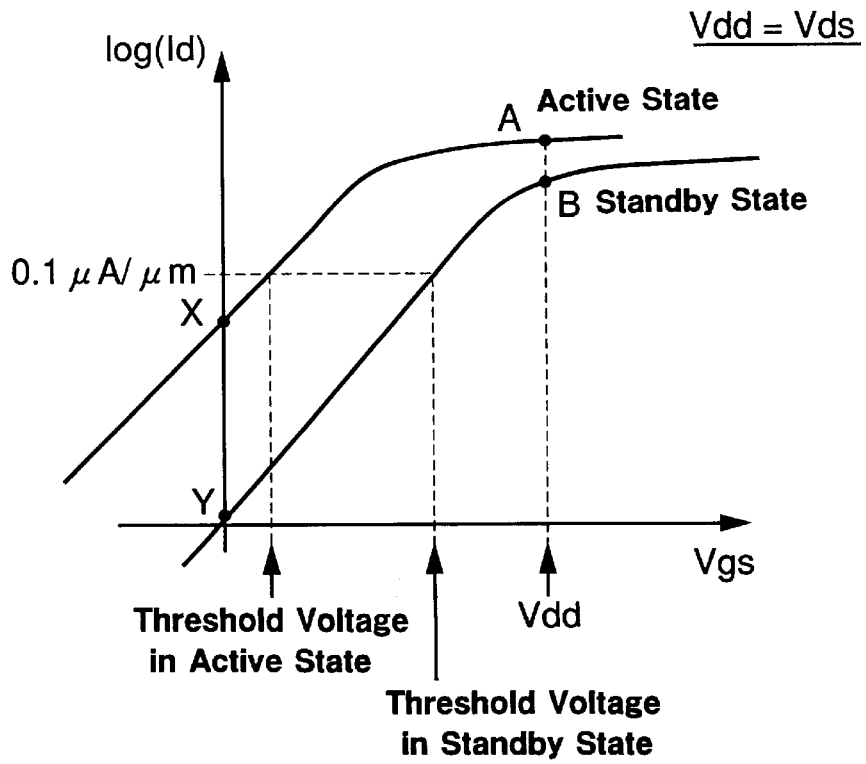
FIG. 7 is a view showing subthreshold characteristics of the transistor when well bias voltages different between an active state and a standby state are applied in the SOI semiconductor device of the present invention.

Therefore, the threshold voltage in the active state may be made smaller than the threshold voltage in the standby state by applying different bias voltages to the well between the active state and the standby state in the n-type MOS transistor of the SOI semiconductor device of the present invention, namely, by applying a high bias voltage $V_w$ (for example, 0.6 V) in the active state and applying a low voltage $V_W$ (for example, 0 V) in the standby state, as shown in FIG. 7. In accordance with the decrease in the threshold voltage, the drain current obtained by application of the same voltage as the power voltage $V_{dd}$ to the gate voltage $V_{gs}$ may be increased (point A in FIG. 7). This shows that the driving capability of the SOI semiconductor device may be improved.

In addition, the threshold voltage in the standby state may be made larger than the threshold voltage in the active state. In accordance with the increase in the threshold voltage, the drain current obtained by applying 0 V to the gate voltage $V_{gs}$ may be decreased (point X (about 100 pA/μm) to point Y (about 0.1 pA/μm) in FIG. 7), thereby reducing the electric current consumption in the standby state.

Further, the effect of preventing increase in the cell area was studied in the SOI semiconductor device of the present invention. Namely, in the same manner as the above Example, one or more NMOSFETs and one well-contact were formed in a P-well to measure the change in the relative ratio of the area occupied per one NMOSFET when the number of NMOSFETs per one well-contact is increased. This measurement was carried out using an NMOSFET with a gate length of 0.35 μm and a gate width of 5.0 μm. The result is shown in FIG. 8.

In view of the area occupied by the device isolation film, the relative ratio of the area occupied by one NMOSFET was represented by a ratio relative to one body-contact, namely, (area occupied by one NMOSFET when a well-contact is used)/(area occupied by one NMOSFET when a body-contact is used), since one body-contact is always required to one NMOSFET.

Also, for comparison, measurement was carried out for the ratio of the area occupied by one NMOSFET when neither the well-contact nor the body-contact was formed relative to the area occupied by one NMOSFET when the body contact was used. The relative ratio was found to be approximately 0.74.

Figure 8:
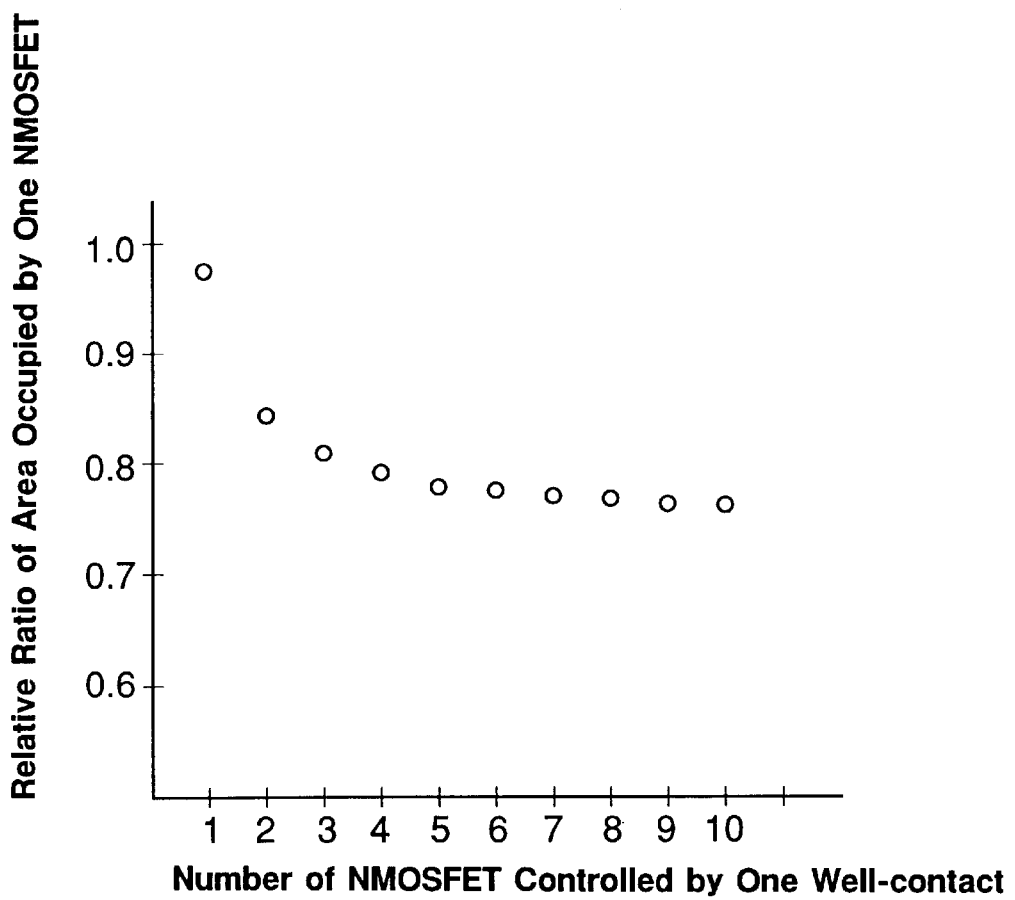
FIG. 8 is a view showing effects of decrease in a cell area of the SOI semiconductor device of the present invention.

From the measurement result shown in FIG. 8, it will be understood that the cell area may be reduced by about 20% or more when four or more NMOSFETs, for example, are controlled by one well-contact, as compared with the case in which a semiconductor device using a body-contact is formed.

Therefore, the SOI semiconductor device of the present invention makes it possible to keep the increase in the cell area to the minimum as compared with a conventionally-used semiconductor device including a body-contact.

Also, the load capacitance in the SOI semiconductor device of the present invention was studied.

Figure 9:
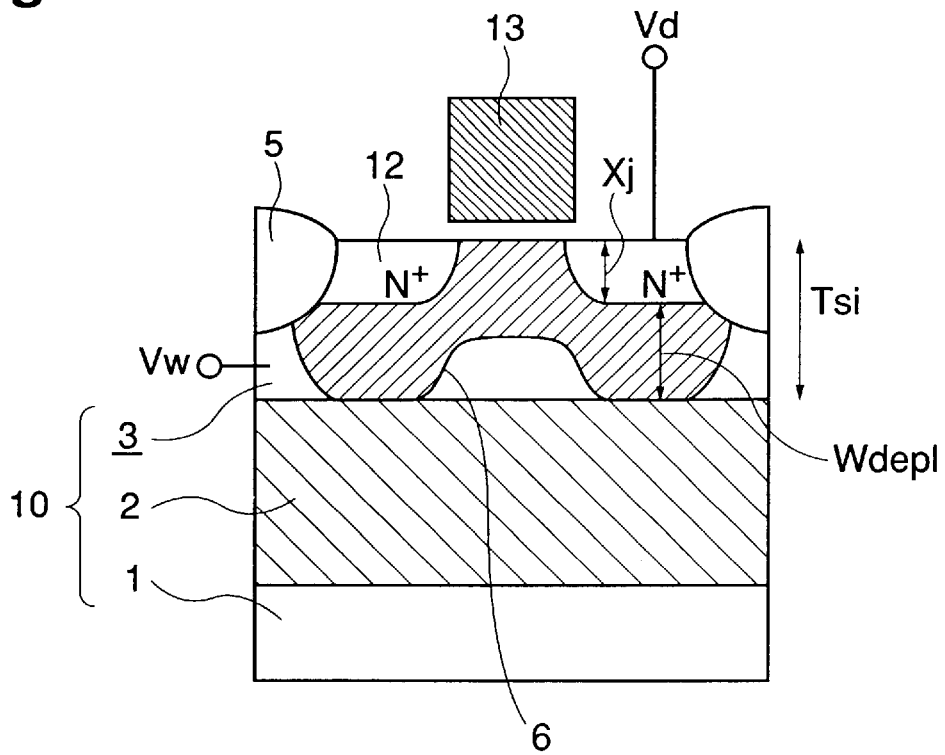
FIG. 9 is a conceptual view for explaining the thickness of a surface semiconductor layer, the depth of source/drain regions and the width of a depletion layer in the SOI semiconductor device of the present invention.

Referring to FIG. 9, the capacitance of the depleted layer 6, coupled with the capacitance of the buried dielectric film 2, can be greatly reduced by adjusting the thickness $T_{si}$ of the surface silicon layer 3 to be smaller than a sum of the junction depth $X_j$ of the source/drain regions 12 and the width $W_{depl}$ of the depleted layer 6 formed thereunder in the NMOSFET, for example, by setting the thickness $T_{si}$ of the surface silicon layer 3 to be about 180 nm, setting the depth $X_j$ of the source/drain regions 12 to be about 150 nm, and setting the width $W_{depl}$ of the depleted layer 6 to be about 30 nm. This leads to reduction in the load capacitance of the transistor and further to the achievement of high speed operation of the device as a whole.

Figure 11A:
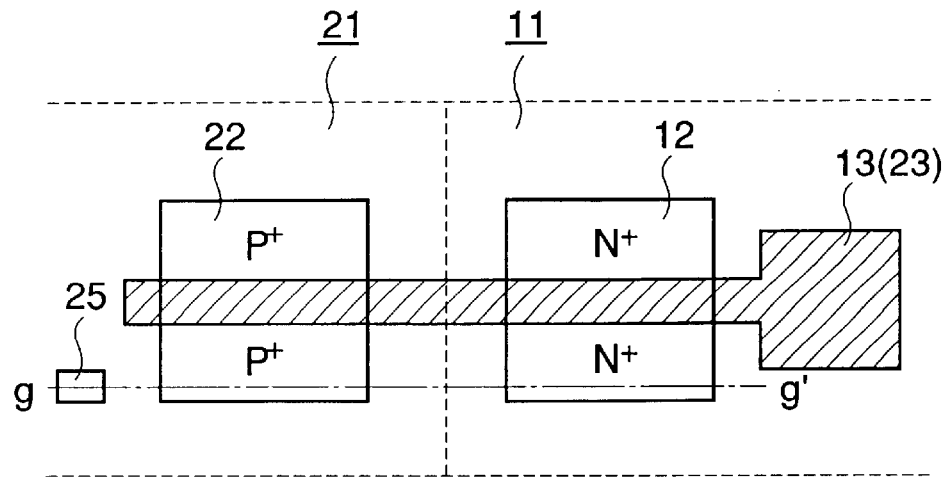
FIGS. 11(a) to 11(c) are views showing another plan view, a cross-sectional view and an equivalent circuit diagram, respectively, of the SOI semiconductor device of the present invention.
Figure 11B:
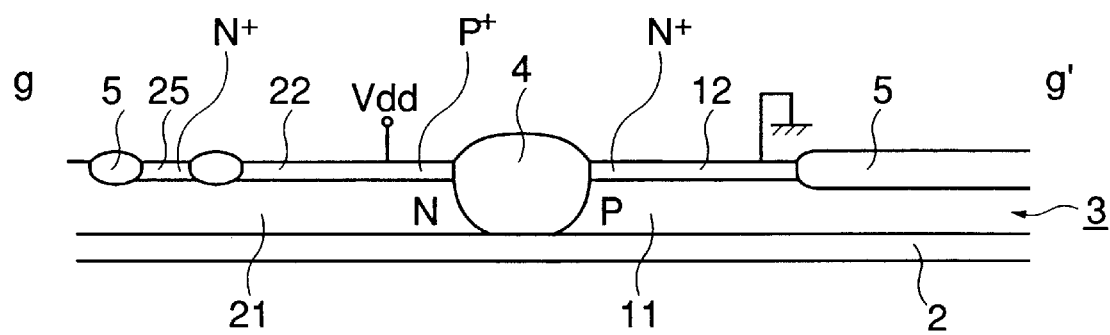
Figure 11C:
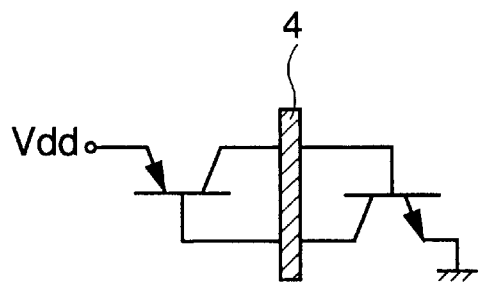
Figure 12:
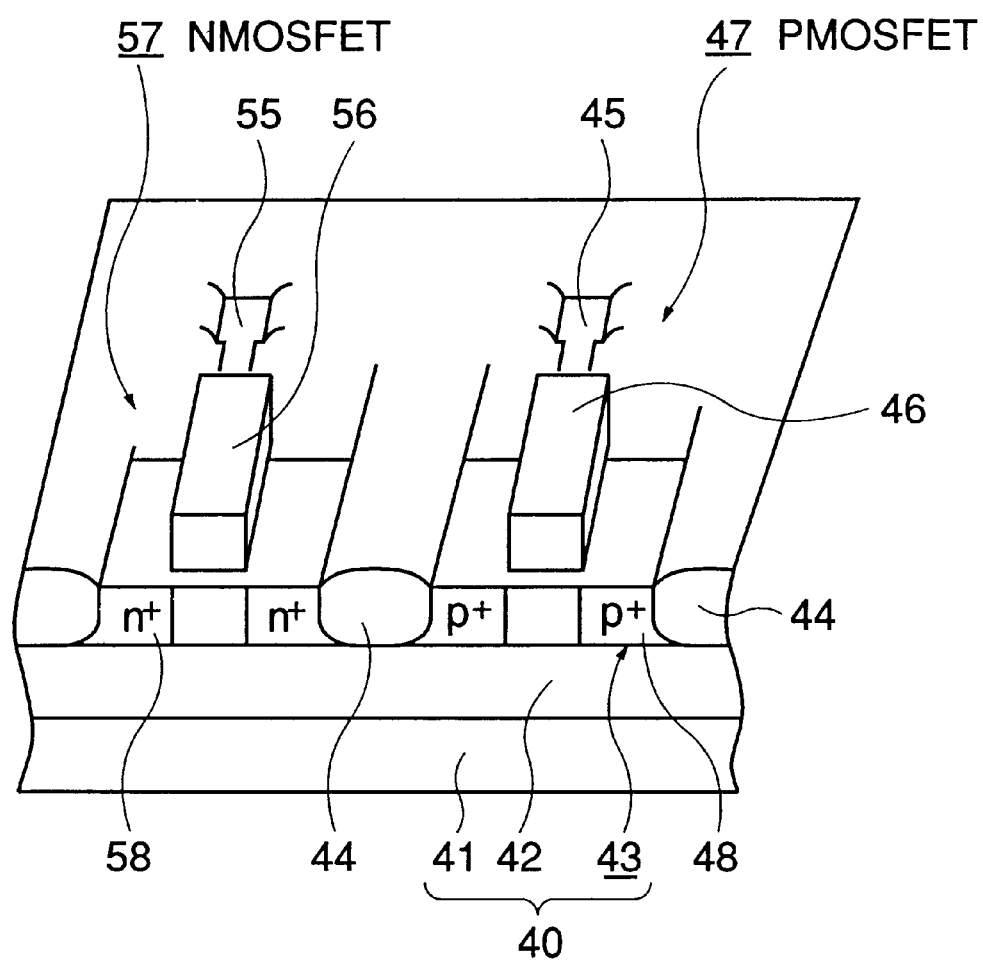
FIG. 12 is a schematic perspective cross-sectional view showing a conventional four-terminal device.

Further, the SOI semiconductor device of the present invention includes a well complete-isolation film for providing complete isolation between the wells, as shown in FIGS. 11(a) to 11(c). Therefore, generation of a parasitic thyristor caused by contact of the N-well and the P-well can be prevented, thereby suppressing a latch-up in the semiconductor device.

Alternatively, the well complete-isolation film can also be formed by the trench isolation method instead of the above-mentioned LOCOS method.

First, the surface silicon layer in the SOI substrate is thermally oxidized to form an oxide film in the surface of the surface silicon layer, and then a silicon nitride film is deposited. Subsequently, by a photolithography and etching process, an opening is formed at a region of the silicon nitride film where a well complete-isolation film is to be formed. Then, an oxide film such as TEOS is deposited in the opening. Thereafter, the surface of the oxide film is planarized by the CMP method or the like, followed by removal of the silicon nitride film with phosphoric acid to form the well complete-isolation film by trench isolation.

Still alternatively, the well complete-isolation film may be formed by the mesa isolation method instead of the above-mentioned LOCOS method or trench isolation method. First, by a photolithography process, a resist mask is formed which is open at a desired region in the surface silicon layer of the SOI substrate. With this resist mask used as a mask, the surface silicon layer at the desired region for isolation is removed by the dry-etching method using an HBr-based or HCl-based gas, so as to completely isolate the wells by mesa isolation.

According to the present invention, the threshold voltage of the transistor can be dynamically controlled by utilizing the well-contact. This can reduce the electric current consumption in the standby state while maintaining the high driving capability in the active state.

In addition, while realizing the improvement in the driving capability and reduction in the electric current consumption, the cell area can be reduced to the minimum without increase in the area occupied by the device such as in the case of a conventional four-terminal device, thereby achieving a highly efficient and highly integrated semiconductor device.

Also, the surface semiconductor layer has a thickness smaller than the sum of the junction depth of the source/drain regions and the width of the depleted layer formed thereunder. Therefore, the capacitance of the depleted layer is connected to the capacitance of the buried oxide film in series, whereby the load capacitance of the transistor is considerably reduced, achieving a high speed operation of the device.

Further, since the well is completely isolated from other regions in the surface semiconductor layer, the generation of a parasitic thyristor, which is present in a conventional twin-well device, can be prevented, thereby achieving a latch-up free structure.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A SOI semiconductor device, comprising:
    an SOI substrate in which a buried dielectric film and a surface semiconductor layer are laminated;
    at least one well formed in the surface semiconductor layer;
    at least one transistor which is formed in the well and includes a channel region and source/drain regions in the surface semiconductor layer, wherein the well is completely isolated in the surface semiconductor layer and includes a well-contact for applying a bias voltage to the well;
    the transistor is isolated by a device isolation film formed in a surface of the surface semiconductor layer, and includes means for controlling a threshold voltage of the transistor by changing the bias voltage applied to said well via said well-contact between an active state and a standby state of the transistor; and
    wherein the channel region is partially depleted, and the surface semiconductor layer under the source/drain is fully depleted.

2. A semiconductor device according to claim 1, wherein the surface semiconductor layer has a film thickness $T_{semi}$ which is smaller than or equal to a sum of a depth $X_j$ of the source/drain regions and a width $W_{dep1}$ of the depleted layer under the source/drain regions from a junction interface and larger than or equal to 100 nm, and a junction capacitance of the source/drain regions is connected to a capacitance of the buried dielectric film in series in a film thickness direction.

3. A method for manufacturing a SOI semiconductor device according to claim 1, wherein complete isolation of the well is achieved by forming a dielectric film that reaches the buried dielectric film in a predetermined region of the surface semiconductor layer.

4. A semiconductor device according to claim 1, wherein said channel region is partially depleted under a central portion of a gate electrode.

5. The semiconductor device of claim 1, wherein the transistor is a MOSFET.

6. The semiconductor device of claim 1, wherein said means for controlling the threshold voltage controls the bias voltage by lowering the threshold voltage at the active state and increasing the threshold voltage at the standby state.

7. A SOI semiconductor device, comprising:
    an SOI substrate in which a buried dielectric film and a surface semiconductor layer are laminated;
    at least one well formed in said surface semiconductor layer;
    at least one transistor formed at least partially in said well having a channel region and source/drain regions in said surface semiconductor layer, wherein said well is isolated in said surface semiconductor layer;
    a well contact for applying a bias voltage to said well;
    wherein said transistor is isolated by a device isolation film formed in a surface of said surface semiconductor layer;
    wherein said surface semiconductor layer under said source and drain regions is fully depleted;
    wherein said channel region is partially depleted to an extent sufficient so that electric power consumption in a standby state of the transistor can be reduced; and
    threshold voltage control means for controlling a threshold voltage of the transistor by changing the bias voltage applied to said well via said well contact between an active state and a standby state of the transistor.

8. The SOI semiconductor device of claim 7, wherein said threshold voltage control means lowers the threshold voltage via the well contact in the active state and increases the threshold voltage via the well contact in the standby state so that the threshold voltage is higher in the standby state than in the active state.

* * * * *